US006950979B2

United States Patent
Zhang et al.

(12) United States Patent
(10) Patent No.: US 6,950,979 B2
(45) Date of Patent: Sep. 27, 2005

(54) LOW COMPLEXITY ENCODER AND DECODER

(75) Inventors: Yan Zhang, Cupertino, CA (US); Tibor Boros, San Francisco, CA (US)

(73) Assignee: Arraycomm Inc., San Jose, CA (US)

( * ) Notice: Subject to any disclaimer, the term of this patent is extended or adjusted under 35 U.S.C. 154(b) by 236 days.

(21) Appl. No.: 10/393,706

(22) Filed: Mar. 20, 2003

(65) Prior Publication Data

US 2004/0187071 A1 Sep. 23, 2004

(51) Int. Cl.$^7$ ............................................... H03M 13/00
(52) U.S. Cl. .................................................... 714/801
(58) Field of Search ................................ 714/800–804, 714/807, 703, 52, 785–786

(56) References Cited

U.S. PATENT DOCUMENTS

| | | | | | |
|---|---|---|---|---|---|
| 4,184,630 | A | * | 1/1980 | Woodward et al. | 714/703 |
| 4,388,684 | A | * | 6/1983 | Nibby et al. | 714/52 |
| 5,912,905 | A | * | 6/1999 | Sakai et al. | 714/784 |
| 6,029,264 | A | * | 2/2000 | Kobayashi et al. | 714/755 |
| 6,031,875 | A | * | 2/2000 | Im | 375/262 |

OTHER PUBLICATIONS

Oenning et al., A low-density generator matrix interpretation of parallel concatenated single bit parity codes, Mar. 2001, IEEE, Trans on Magnetics, vol. 37, No. 2, p. 737–741.*

Patent Cooperation Treaty (PCT), The Internationational Search Report, International application No. PCT/US04/08279, Jan. 19, 2005, 4 pgs.

* cited by examiner

Primary Examiner—Shelly A Chase
(74) Attorney, Agent, or Firm—Blakely, Sokoloff, Taylor & Zafman LLP

(57) ABSTRACT

In one embodiment of the present invention, the efficiency of an encoder can be maintained while reducing the complexity of a decoder. In one embodiment, the invention includes a communication system in which a transmitter has a pipelined encoder that includes a controller that does not access a look-up table to encode a block of data bits into a binary codeword, and in which a receiver has a decoder to receive the binary codeword after transmission through a communications medium, and to correct an error in the binary codeword introduced during transmission without using a look-up table.

13 Claims, 4 Drawing Sheets

LOW COMPLEXITY ENCODER AND DECODER

BACKGROUND OF THE INVENTION

1. Field of the Invention

The present invention applies to the field of data coding and, in particular, to an encoder and a decoder.

2. Description of the Prior Art

Digital devices, such as computers and various digital communications equipment, store and process data as binary digits, also known as bits. A bit is either zero or one (0 or 1). All digital information, such as mp3 files, jpeg images, text files, DVD movies, and so on are stored as a collection of bits. When bits are transferred over a communication medium, errors may be introduced so that the bits received are not identical to the original bits. To ensure the accuracy of received data, various error detection and correction devices have been developed. A device that can detect an error can ask for retransmission. A device that can correct errors can perform correction on the received data.

These error detection and correction techniques include parity check codes, checksums, block codes such as Hamming codes, and cyclic redundancy checks. Using a Hamming encoder on a block of data bits produces a codeword that can be decoded to correct one error. Most Hamming encoders, and other linear block encoders, operate by generating parity bits over the block of data being encoded and adding the parity bits to the data block to create a codeword.

The codeword is then modulated and sent over a communications medium such as radio waves, optical fiber, coaxial cable, twisted pair wires, integrated circuit, or a computer bus. The received codeword may have an error in it. For example, if the sent codeword is "0011001" and the received codeword is "0001001," then there is an error in position three (counting left to right). A decoder then generates a syndrome of the received codeword that can be used to locate an error in the received codeword. Hamming codes are well known, and discussions and examples can be found in many textbooks concerning Digital Communications.

When implemented in hardware, the encoder that generates the codeword and the decoder that corrects an error introduced during transmission have look-up tables that are used to generate the parity and syndrome bits and to map the syndrome to the location of the error. Such look-up tables add memory and complexity to the encoder and the decoder. Furthermore, some encoders are not pipelined, resulting in a need for rewriteable memory that adds complexity and cost to the hardware, and takes up valuable die area on a chip.

BRIEF SUMMARY OF THE INVENTION

In one embodiment of the present invention, the efficiency of an encoder can be maintained while reducing the complexity of a decoder. In one embodiment, the invention includes a communication system in which a transmitter has a pipelined encoder that includes a controller that does not access a look-up table to encode a block of data bits into a binary codeword, and in which a receiver has a decoder to receive the binary codeword after transmission through a communications medium, and to correct an error in the binary codeword introduced during transmission without using a look-up table.

BRIEF DESCRIPTION OF THE DRAWINGS

The present invention is illustrated by way of example, and not by way of limitation, in the figures of the accompanying drawings in which like reference numerals refer to similar elements and in which.

DETAILED DESCRIPTION OF THE INVENTION

According to one embodiment of the invention, a pipelined Hamming encoder has a simple controller that generates enable and disable signals for parity generators without a look-up table. A corresponding Hamming decoder also has a simple controller that generates enable and disable signals for syndrome generators without a look-up table, and can map the syndrome to the error position without a look-up table.

Encoder

A Hamming encoder takes a block of data bits and generates a codeword by adding enough parity bits so that a decoder can correct exactly one bit error. The parity bits depend on the data bits, and thus do not contain any new information, but are redundant for error correction. Each legal codeword differs from any other legal codeword in three positions. Therefore, a codeword with a single bit error will most closely resemble only one codeword.

A parity bit checks the parity of a collection, i.e. subset, of data bits. Even parity checking means that the sum of the bits checked by the parity bit and the parity bit itself is even, i.e. their binary sum is zero. A parity bit can be generated by performing a binary add operation over all the bits checked by the parity bit. For ease of understanding, each parity bit is assumed to be an even parity bit, but the invention is equally applicable to odd parity bits, which are simply binary complements of even parity bits. Parity bits and parity checking is well known in the art.

A Hamming codeword is decoded by generating a syndrome using the codeword. The bits of the syndrome are calculated using parity checking in a similar manner as the parity bits. However, the syndrome bits are not added to the codeword. Instead, the syndrome can be used to locate a bit error in the codeword. That is, the syndrome will either indicate no errors, or can be used to determine the position of one error.

Figure 1:
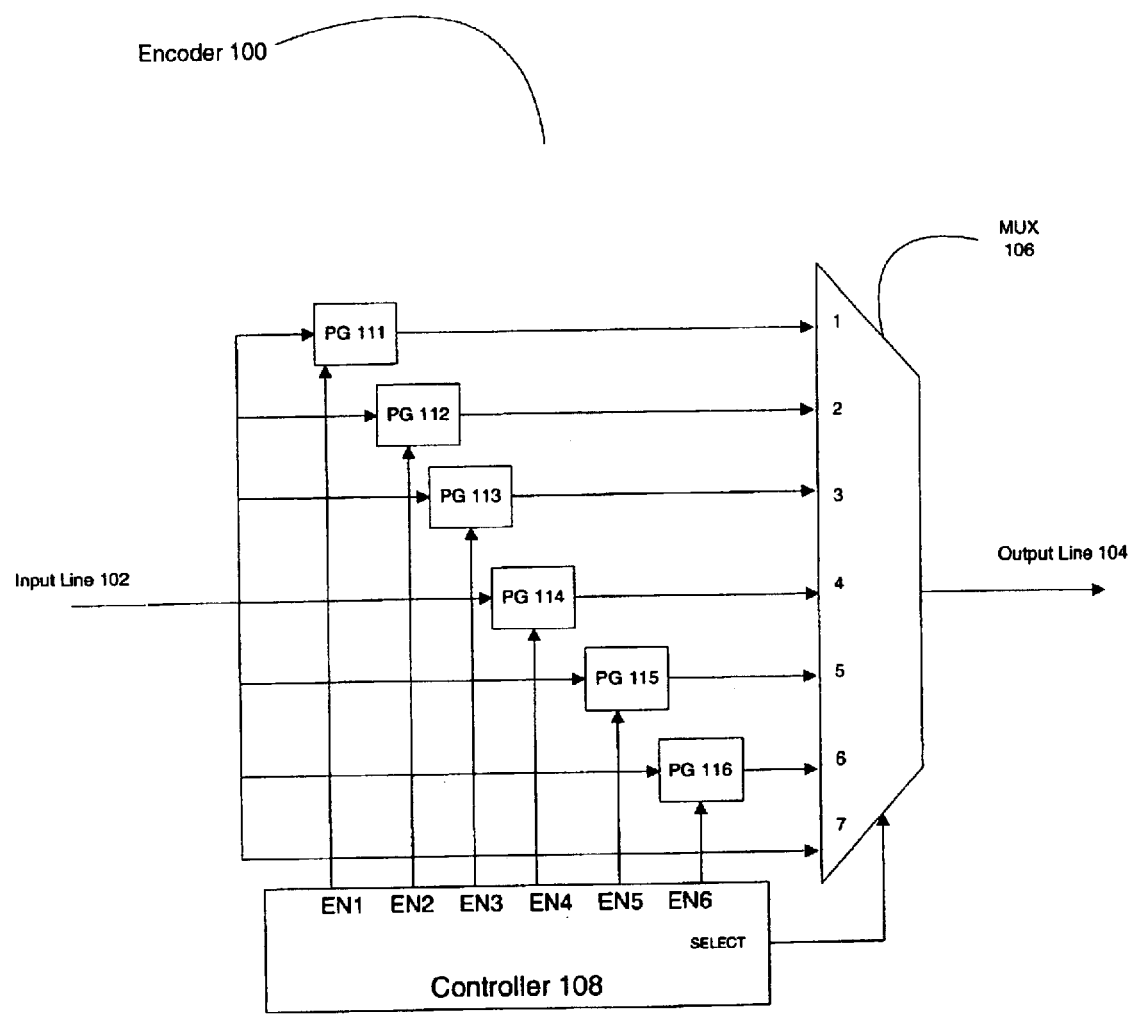
FIG. 1 is a simplified block diagram of hardware circuitry representing an encoder according to one embodiment of the present invention.

One embodiment of the present invention uses an encoder as shown in FIG. 1 to generate the codeword in hardware circuitry. In the encoder 100 in FIG. 1, a block of fifty-seven data bits arrives in a serial fashion on the input line 102. The encoder 100 generates six parity bits using the fifty-seven data bits. Those skilled in the art will recognize this as HAM(6) encoder. The input line 102 feeds the data bits to six parity generators ("PGs") 111–116 and to a seven-to-one multiplexer (MUX) 106. The parity generators 111–116 each provide one parity bit to the MUX. The MUX outputs the data bits and the parity bits to an output line 104.

The operation of the parity generators 111–116 and the MUX 106 is controlled by a controller 108. In each clock cycle, the controller either enables or disables each parity generator individually using enable signals EN1–EN6. The enable signals EN1–EN6 can be implemented as high-enables, low-enables, or in any other manner. When a parity generator is enabled, it uses the data bit fed from the input line 102 in that same clock cycle to calculate its respective parity bit.

Thus, e.g., parity generator 112 checks the data bits that are fed from the input line 102 during cycles that the controller 108 enables parity generator 112 using enable signal EN2. The parity generators 111–116 can be implemented using a feedback register and an XOR gate. In each clock cycle, the controller 108 also selects which of the seven inputs the MUX 106 will send to the output line 104 using a select line.

The encoder 100 in FIG. 1 does not show a memory or storage unit. In one embodiment, the encoder does not need a memory unit, because the encoder is pipelined, that is, performs encoding using pipeline processing. Pipeline processing, or pipelining, generally refers to a category of techniques that provide simultaneous, or parallel, processing within a component by overlapping operations by moving data or instructions into a conceptual pipe with all stages of the pipe processing simultaneously.

In the encoder context, pipelining means that data bits do not need to be stored, but can be sent to the output line 104 as they are received. That is, the data bits do not need to wait for the parity bits. In other words, each parity bit is only sent to the output line 104 after each data bit checked by that parity bit has been sent to the output line 104. For example, if parity generator 111 generates the first parity bit checks data bits 1–31, the parity bit generated by parity generator 11 will not be sent to the output line 104 from the MUX 106 before data bits 1–31.

Thus, a pipelined encoder can be defined as one that generates a codeword in which the position of each parity bit is after the positions of all data bits checked by each respective parity bit. For example, an encoder that generates a codeword with all parity bits at the end, such as in the example above, would be pipelined. In one embodiment, each parity bit is sent to the output line 104 as soon as it is ready. That is, no data bits are sent to the output line 104 from the MUX 106 until all ready parity bits are sent. In the example above, the first parity bit would be output in position 32, immediately after data bit 31. If an encoder is not pipelined, it needs a rewritable data storage unit, such as a random access memory ("RAM") to store the data bits while the parity bits are being computed.

As described above, at each clock cycle the controller 108 selectively enables and disables the parity generators 111–116. Representing an enable signal with a binary 1 and a disable signal—or lack of enable signal—with a binary 0, at each clock the controller 108 generates a six-bit number to control the parity generators 111–116. For example, the number 011001 would indicate that during this clock cycle the data bit read from the input line 102 will be used by parity generators 112, 113, and 116. In other words, parity bits 2, 3, and 6 check (by XOR-ing) the data bit read from the input line 102 during this clock.

The sequence of enable signals can be stored in a look-up table in the controller 108 or accessible to the controller 108. A look-up table can be a read only memory ("ROM") or any other data storage unit. In one embodiment, the controller 108 does not need to access a look-up table, but can generate the enable signals using simple circuitry. In one embodiment, the controller 108 uses a counter to generate the enable signals. Table 1 demonstrates how a counter can be used to generate enable signals. Table 1 also shows the select signal for ease of understanding. In Table 1, data bits from the input line 102 are represented by "D" and parity bits are represented by "P." For example, D31 is the thirty-first data bit.

TABLE 1

| Clock Cycle | Output | EN1 | EN2 | EN3 | EN4 | EN5 | EN6 | SELECT |
|---|---|---|---|---|---|---|---|---|
| 1 | D1 | 1 | 1 | 1 | 1 | 1 | 1 | 7 |
| 2 | D2 | 1 | 1 | 1 | 1 | 1 | 0 | 7 |
| 3 | D3 | 1 | 1 | 1 | 1 | 0 | 1 | 7 |
| 4 | D4 | 1 | 1 | 1 | 1 | 0 | 0 | 7 |
| 5 | D5 | 1 | 1 | 1 | 0 | 1 | 1 | 7 |
| 6 | D6 | 1 | 1 | 1 | 0 | 1 | 0 | 7 |
| 7 | D7 | 1 | 1 | 1 | 0 | 0 | 1 | 7 |
| 8 | D8 | 1 | 1 | 1 | 0 | 0 | 0 | 7 |
| 9 | D9 | 1 | 1 | 0 | 1 | 1 | 1 | 7 |
| 10 | D10 | 1 | 1 | 0 | 1 | 1 | 0 | 7 |
| 11 | D11 | 1 | 1 | 0 | 1 | 0 | 1 | 7 |
| 12 | D12 | 1 | 1 | 0 | 1 | 0 | 0 | 7 |
| 13 | D13 | 1 | 1 | 0 | 0 | 1 | 1 | 7 |
| 14 | D14 | 1 | 1 | 0 | 0 | 1 | 0 | 7 |
| 15 | D15 | 1 | 1 | 0 | 0 | 0 | 1 | 7 |
| 16 | D16 | 1 | 1 | 0 | 0 | 0 | 0 | 7 |
| 17 | D17 | 1 | 0 | 1 | 1 | 1 | 1 | 7 |
| 18 | D18 | 1 | 0 | 1 | 1 | 1 | 0 | 7 |
| 19 | D19 | 1 | 0 | 1 | 1 | 0 | 1 | 7 |
| 20 | D20 | 1 | 0 | 1 | 1 | 0 | 0 | 7 |
| 21 | D21 | 1 | 0 | 1 | 0 | 1 | 1 | 7 |
| 22 | D22 | 1 | 0 | 1 | 0 | 1 | 0 | 7 |
| 23 | D23 | 1 | 0 | 1 | 0 | 0 | 1 | 7 |
| 24 | D24 | 1 | 0 | 1 | 0 | 0 | 0 | 7 |
| 25 | D25 | 1 | 0 | 0 | 1 | 1 | 1 | 7 |
| 26 | D26 | 1 | 0 | 0 | 1 | 1 | 0 | 7 |
| 27 | D27 | 1 | 0 | 0 | 1 | 0 | 1 | 7 |
| 28 | D28 | 1 | 0 | 0 | 1 | 0 | 0 | 7 |
| 29 | D29 | 1 | 0 | 0 | 0 | 1 | 1 | 7 |
| 30 | D30 | 1 | 0 | 0 | 0 | 1 | 0 | 7 |
| 31 | D31 | 1 | 0 | 0 | 0 | 0 | 1 | 7 |
| 32 | P1 | 1 | 0 | 0 | 0 | 0 | 0 | 1 |
| 33 | D32 | 0 | 1 | 1 | 1 | 1 | 1 | 7 |
| 34 | D33 | 0 | 1 | 1 | 1 | 1 | 0 | 7 |
| 35 | D34 | 0 | 1 | 1 | 1 | 0 | 1 | 7 |
| 36 | D35 | 0 | 1 | 1 | 1 | 0 | 0 | 7 |
| 37 | D36 | 0 | 1 | 1 | 0 | 1 | 1 | 7 |
| 38 | D37 | 0 | 1 | 1 | 0 | 1 | 0 | 7 |
| 39 | D38 | 0 | 1 | 1 | 0 | 0 | 1 | 7 |
| 40 | D39 | 0 | 1 | 1 | 0 | 0 | 0 | 7 |
| 41 | D40 | 0 | 1 | 0 | 1 | 1 | 1 | 7 |
| 42 | D41 | 0 | 1 | 0 | 1 | 1 | 0 | 7 |
| 43 | D42 | 0 | 1 | 0 | 1 | 0 | 1 | 7 |
| 44 | D43 | 0 | 1 | 0 | 1 | 0 | 0 | 7 |
| 45 | D44 | 0 | 1 | 0 | 0 | 1 | 1 | 7 |
| 46 | D45 | 0 | 1 | 0 | 0 | 1 | 0 | 7 |
| 47 | D46 | 0 | 1 | 0 | 0 | 0 | 1 | 7 |
| 48 | P2 | 0 | 1 | 0 | 0 | 0 | 0 | 2 |
| 49 | D47 | 0 | 0 | 1 | 1 | 1 | 1 | 7 |
| 50 | D48 | 0 | 0 | 1 | 1 | 1 | 0 | 7 |
| 51 | D49 | 0 | 0 | 1 | 1 | 0 | 1 | 7 |
| 52 | D50 | 0 | 0 | 1 | 1 | 0 | 0 | 7 |
| 53 | D51 | 0 | 0 | 1 | 0 | 1 | 1 | 7 |
| 54 | D52 | 0 | 0 | 1 | 0 | 1 | 0 | 7 |
| 55 | D53 | 0 | 0 | 1 | 0 | 0 | 1 | 7 |
| 56 | P3 | 0 | 0 | 1 | 0 | 0 | 0 | 3 |
| 57 | D54 | 0 | 0 | 0 | 1 | 1 | 1 | 7 |
| 58 | D55 | 0 | 0 | 0 | 1 | 1 | 0 | 7 |
| 59 | D56 | 0 | 0 | 0 | 1 | 0 | 1 | 7 |
| 60 | P4 | 0 | 0 | 0 | 1 | 0 | 0 | 4 |
| 61 | D57 | 0 | 0 | 0 | 0 | 1 | 1 | 7 |
| 62 | P5 | 0 | 0 | 0 | 0 | 1 | 0 | 5 |
| 63 | P6 | 0 | 0 | 0 | 0 | 0 | 1 | 6 |

Table 1 demonstrates that the six-bit enable signal generator counts backwards from 63 to 1 with each clock cycle. For example, in the row labeled clock cycle one, the six bit number is "111111," the binary representation of 63.

Similarly, in the row labeled clock cycle two, the six-bit number is "111110," the binary representation of 62, an so on counting backwards to 1. Since a down counter, i.e. a backwards counter, can be implemented using simple circuitry, no look-up table is needed to store the enable sequences. The parity clock cycles—cycles 32, 48, 56, 60, 62, and 63—can be altered, for example to all 0s, without affecting the functionality of the encoder.

The codeword produced by the encoder 100 is shown in Table 2, where bit positions in the codeword are shown in the first row, and their content in the second row. For example, the $47^{th}$ position of the codeword contains data bit position 46, and the $48^{th}$ position of the codeword contains the second parity bit, i.e., the parity bit generated by parity generator 112.

TABLE 2

| 1–31 | 32 | 33–47 | 48 | 49–55 | 56 | 57–59 | 60 | 61 | 62 | 63 |
|---|---|---|---|---|---|---|---|---|---|---|
| D1–D31 | P1 | D32–D46 | P2 | D47–D53 | P3 | D54–D56 | P4 | D57 | P5 | P6 |

All parity bits are output as soon as possible after they are ready. Every parity bit, except the last, is output immediately after the last data bit checked by the parity bit. Since both P5 and P6 check the last data bit, D57, they are both output after D57.

The encoder 100 is pipelined, thus not requiring storage of the data bits, and has a simple controller 108 that does not need a look-up table, thus not requiring storage of the enable signal sequences. Furthermore, the pipelined encoder 100 does not waste clock cycles waiting for data bits before a parity bit can be sent. The counter-based controller 108 can be used for any number of parity bits or coding schemes.

Decoder

Figure 2:
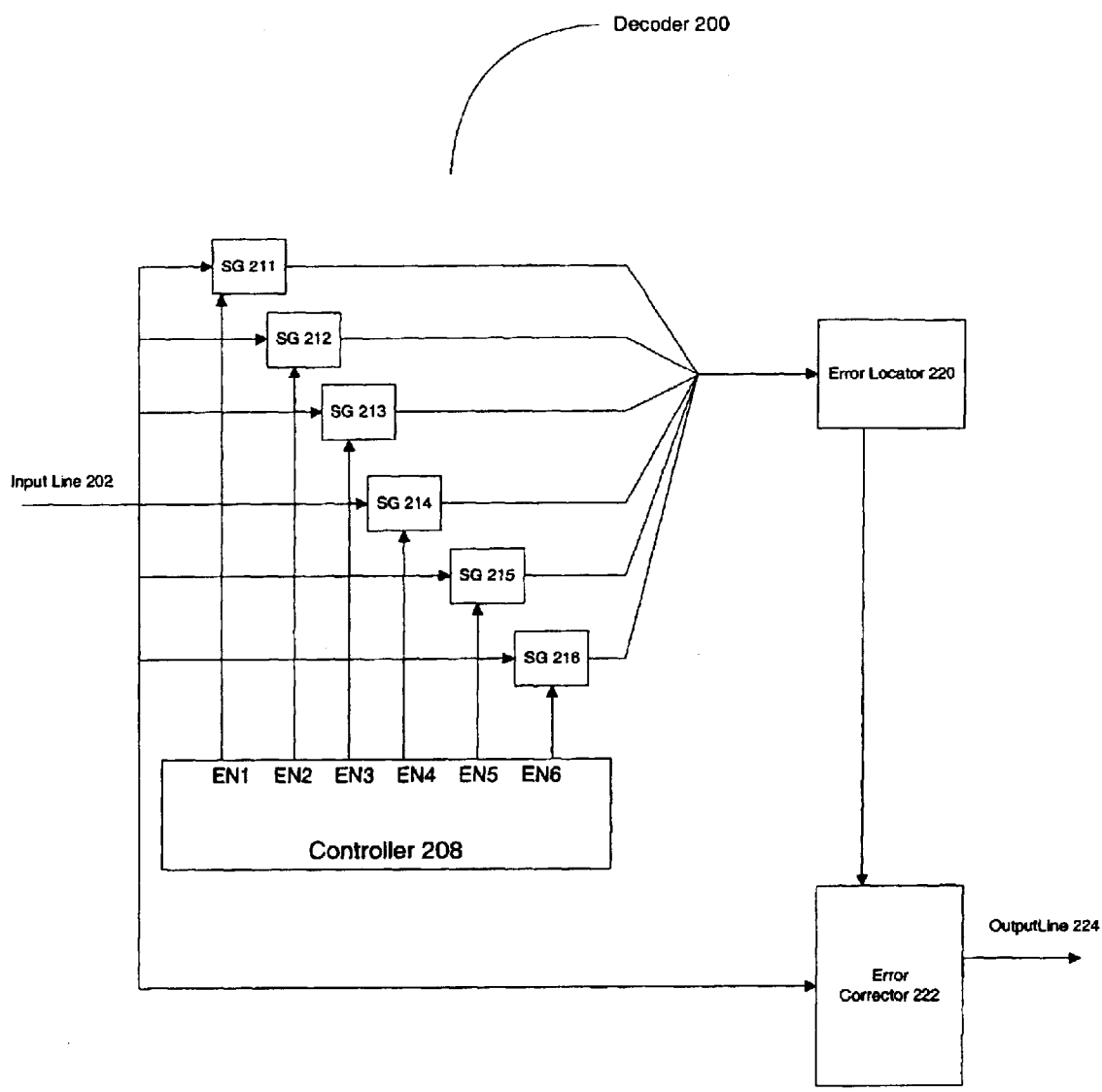
FIG. 2 is a simplified block diagram of hardware circuitry representing a decoder according to one embodiment of the present invention.

One embodiment of the present invention uses a decoder as shown in FIG. 2 to decode the received codeword in hardware circuitry. In the decoder 200 in FIG. 2, a codeword arrives in a serial fashion on the input line 202. In this example, the decoder 200 generates six syndrome bits using the sixty-three bit codeword (fifty-seven data bits and six parity bits) generated by the encoder 100 and shown in Table 2.

The syndrome is generated using the syndrome generators ("SGs") 211–216 that are controlled by a controller 208 in a similar fashion as the parity generators 111–116 are controlled by the controller 108 in the encoder 100 discussed with reference to FIG. 1. Each syndrome generator 211–216 generates one syndrome bit that calculates parity over certain bits of the codeword resulting in a six-bit syndrome. The syndrome generators 211–216 can be implemented using circuitry similar, or identical, to the parity generators.

The syndrome is used by an error locator 220 to find the location of a bit error, if any, and provide that location to an error corrector 222. In one embodiment, the error corrector 222 simply flips the bit in the position indicated by the error locator 220. The corrected codeword is then provided to the output line 224. The output line 224 can be a serial, parallel, or other link.

In one embodiment of the present invention, the error locator 220 can convert the syndrome into the error position without having or accessing a look-up table. To do this, the syndrome can be related to the error position in some logical way. For example, the syndrome may be the binary representation of the position of the bit error. In one embodiment, the error locator 220 can calculate the error position from the syndrome without a look-up table by performing a 2's complement negation operation on the syndrome. In other embodiments, other arithmetic manipulations that can be carried out in circuitry without look-up tables can be used.

In one embodiment, the controller 208 does not need to access a look-up table, but can generate the enable signals using simple circuitry. In one embodiment, the controller 208 uses a counter to generate the enable signals. Table 3 demonstrates how a counter can be used to generate enable signals.

TABLE 3

| Clock Cycle | Input | EN1 | EN2 | EN3 | EN4 | EN5 | EN6 |
|---|---|---|---|---|---|---|---|
| 1 | D1 | 1 | 1 | 1 | 1 | 1 | 1 |
| 2 | D2 | 1 | 1 | 1 | 1 | 1 | 0 |
| 3 | D3 | 1 | 1 | 1 | 1 | 0 | 1 |
| 4 | D4 | 1 | 1 | 1 | 1 | 0 | 0 |
| 5 | D5 | 1 | 1 | 1 | 0 | 1 | 1 |
| 6 | D6 | 1 | 1 | 1 | 0 | 1 | 0 |
| 7 | D7 | 1 | 1 | 1 | 0 | 0 | 1 |
| 8 | D8 | 1 | 1 | 1 | 0 | 0 | 0 |
| 9 | D9 | 1 | 1 | 0 | 1 | 1 | 1 |
| 10 | D10 | 1 | 1 | 0 | 1 | 1 | 0 |
| 11 | D11 | 1 | 1 | 0 | 1 | 0 | 1 |
| 12 | D12 | 1 | 1 | 0 | 1 | 0 | 0 |
| 13 | D13 | 1 | 1 | 0 | 0 | 1 | 1 |
| 14 | D14 | 1 | 1 | 0 | 0 | 1 | 0 |
| 15 | D15 | 1 | 1 | 0 | 0 | 0 | 1 |
| 16 | D16 | 1 | 1 | 0 | 0 | 0 | 0 |
| 17 | D17 | 1 | 0 | 1 | 1 | 1 | 1 |
| 18 | D18 | 1 | 0 | 1 | 1 | 1 | 0 |
| 19 | D19 | 1 | 0 | 1 | 1 | 0 | 1 |
| 20 | D20 | 1 | 0 | 1 | 1 | 0 | 0 |
| 21 | D21 | 1 | 0 | 1 | 0 | 1 | 1 |
| 22 | D22 | 1 | 0 | 1 | 0 | 1 | 0 |
| 23 | D23 | 1 | 0 | 1 | 0 | 0 | 1 |
| 24 | D24 | 1 | 0 | 1 | 0 | 0 | 0 |
| 25 | D25 | 1 | 0 | 0 | 1 | 1 | 1 |
| 26 | D26 | 1 | 0 | 0 | 1 | 1 | 0 |
| 27 | D27 | 1 | 0 | 0 | 1 | 0 | 1 |
| 28 | D28 | 1 | 0 | 0 | 1 | 0 | 0 |
| 29 | D29 | 1 | 0 | 0 | 0 | 1 | 1 |
| 30 | D30 | 1 | 0 | 0 | 0 | 1 | 0 |
| 31 | D31 | 1 | 0 | 0 | 0 | 0 | 1 |
| 32 | P1 | 1 | 0 | 0 | 0 | 0 | 0 |
| 33 | D32 | 0 | 1 | 1 | 1 | 1 | 1 |
| 34 | D33 | 0 | 1 | 1 | 1 | 1 | 0 |
| 35 | D34 | 0 | 1 | 1 | 1 | 0 | 1 |
| 36 | D35 | 0 | 1 | 1 | 1 | 0 | 0 |
| 37 | D36 | 0 | 1 | 1 | 0 | 1 | 1 |
| 38 | D37 | 0 | 1 | 1 | 0 | 1 | 0 |
| 39 | D38 | 0 | 1 | 1 | 0 | 0 | 1 |
| 40 | D39 | 0 | 1 | 1 | 0 | 0 | 0 |
| 41 | D40 | 0 | 1 | 0 | 1 | 1 | 1 |
| 42 | D41 | 0 | 1 | 0 | 1 | 1 | 0 |
| 43 | D42 | 0 | 1 | 0 | 1 | 0 | 1 |
| 44 | D43 | 0 | 1 | 0 | 1 | 0 | 0 |
| 45 | D44 | 0 | 1 | 0 | 0 | 1 | 1 |
| 46 | D45 | 0 | 1 | 0 | 0 | 1 | 0 |
| 47 | D46 | 0 | 1 | 0 | 0 | 0 | 1 |
| 48 | P2 | 0 | 1 | 0 | 0 | 0 | 0 |
| 49 | D47 | 0 | 0 | 1 | 1 | 1 | 1 |
| 50 | D48 | 0 | 0 | 1 | 1 | 1 | 0 |
| 51 | D49 | 0 | 0 | 1 | 1 | 0 | 1 |
| 52 | D50 | 0 | 0 | 1 | 1 | 0 | 0 |
| 53 | D51 | 0 | 0 | 1 | 0 | 1 | 1 |
| 54 | D52 | 0 | 0 | 1 | 0 | 1 | 0 |
| 55 | D53 | 0 | 0 | 1 | 0 | 0 | 1 |
| 56 | P3 | 0 | 0 | 1 | 0 | 0 | 0 |
| 57 | D54 | 0 | 0 | 0 | 1 | 1 | 1 |
| 58 | D55 | 0 | 0 | 0 | 1 | 1 | 0 |
| 59 | D56 | 0 | 0 | 0 | 1 | 0 | 1 |
| 60 | P4 | 0 | 0 | 0 | 1 | 0 | 0 |
| 61 | D57 | 0 | 0 | 0 | 0 | 1 | 1 |
| 62 | P5 | 0 | 0 | 0 | 0 | 1 | 0 |
| 63 | P6 | 0 | 0 | 0 | 0 | 0 | 1 |

Table 3 demonstrates that the six-bit enable signal generator counts backwards from 63 to 1 with each clock cycle. Since a down counter, i.e. a counter that counts backwards, can be implemented using simple circuitry, no look-up table is needed to store the enable sequences. Since the enable sequences in Table 3 are identical to the enable sequences in Table 1, in this embodiment, controller 108 in FIG. 1 and controller 208 in FIG. 2 can share controller circuitry when located in the same device.

Since the functioning of the encoder affects the decoder, and the functioning of the decoder limits the encoder, a decoder/encoder pair must be designed together. The shortcomings of existing encoders and decoders are discussed with reference to Table 4 below.

TABLE 4

| Encoder | | Decoder | |
|---|---|---|---|
| Pipelined? | Controller without look-up table? | Error locator without look-up table? | Controller without look-up table? |
| YES | NO | NO | NO |
| NO | NO | YES | YES |

Table 4 shows that existing encoder/decoder pairs were either pipelined at the encoder and complex at the decoder, or simple at the decoder and complex and inefficient at the encoder. The encoder 100 described with reference to FIG. 1 and the decoder 200 described with reference to FIG. 2 are designed so that all four columns of Table 1 indicate YES. In the encoder 100, the down counter architecture in the controller 108 provides a pipelined encoder 100 with a simple controller 108. Similarly, in the decoder 200, the down counter architecture in the controller 208 is also simple, and provides for a syndrome that can be mapped to a bit error location without a lookup table.

The above HAM(6) example is merely a demonstration of one embodiment of the present invention. The above conceptual architecture can be used for any length Hamming code. For example, for a HAM(3) code, the encoder and decoder controller would function as shown in Table 5:

TABLE 5

| Clock Cycle | Output/Input | EN1 | EN2 | EN3 |
|---|---|---|---|---|
| 1 | D1 | 1 | 1 | 1 |
| 2 | D2 | 1 | 1 | 0 |
| 3 | D3 | 1 | 0 | 1 |
| 4 | P1 | 1 | 0 | 0 |
| 5 | D4 | 0 | 1 | 1 |
| 6 | P2 | 0 | 1 | 0 |
| 7 | P3 | 0 | 0 | 1 |

Furthermore, the Hamming code need not be fully utilized. For example, in the 57-bit data block further above, only 50 bits may carry data. In addition, neither controller 108 nor controller 208 requires a down counter. Generation of the example enable sequences in Tables 1, 3, and 5 can be performed using any counter or other circuitry not requiring a look-up table. The above conceptual architecture may also be implemented using linear block codes other than Hamming codes.

Base Station Structure

Figure 3:
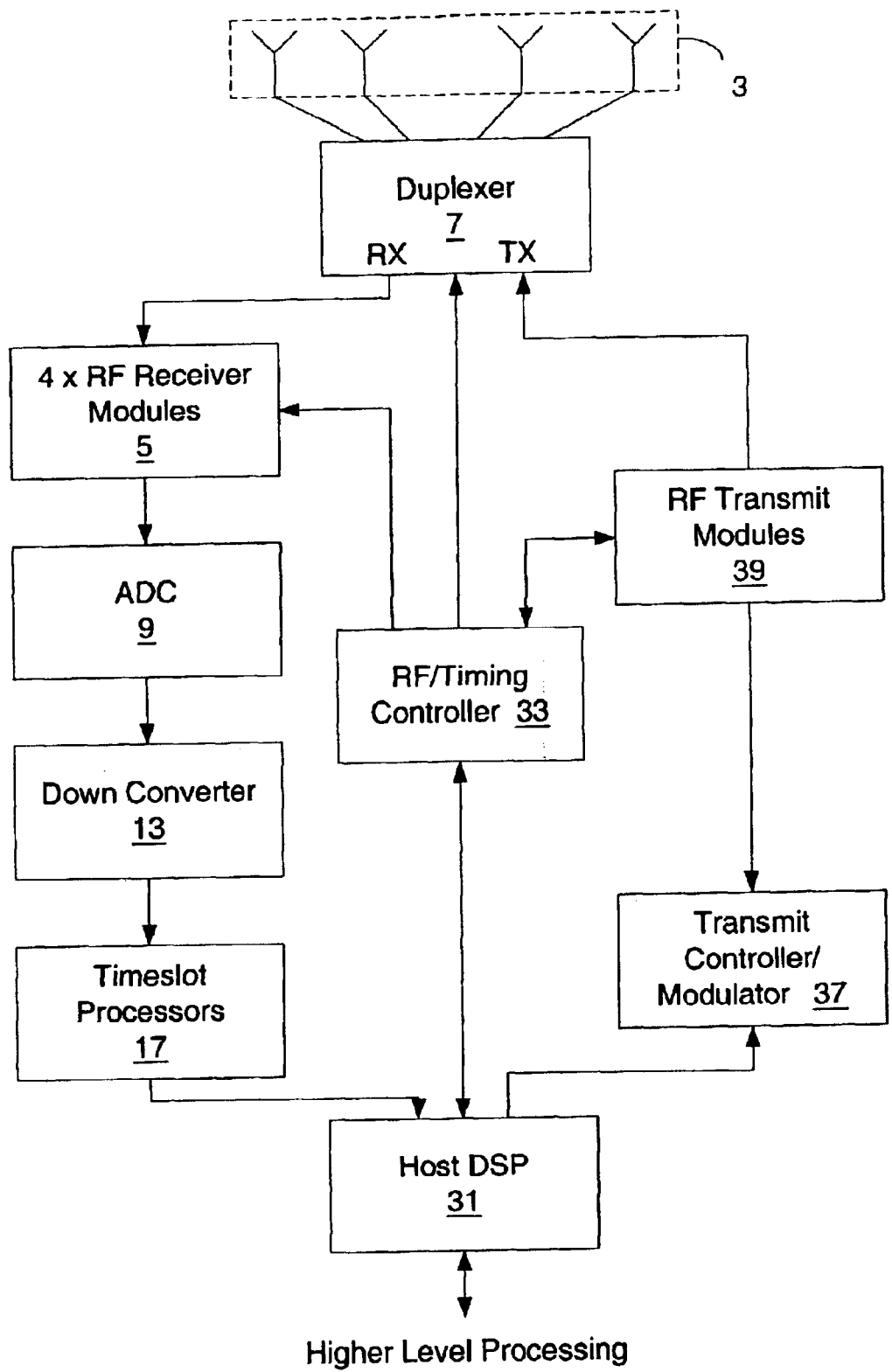
FIG. 3 is a simplified block diagram of a base station on which an embodiment of the invention can be implemented.

The encoder 100, decoder 200, and encoder/decoder pair described with reference to FIGS. 1 and 2 can be used for error correction in any communications system. A base station and a user terminal of a radio communications network that can use the encoder 100 and decoder 200 for error correction is now described. FIG. 3 shows an example of a base station of a wireless communications system or network suitable for implementing the present invention. The system or network includes a number of subscriber stations, also referred to as remote terminals or user terminals, such as that shown in FIG. 4. The base station may be connected to a wide area network (WAN) through its host DSP 31 for providing any required data services and connections external to the immediate wireless system. To support spatial diversity, a plurality of antennas 3 is used, for example four antennas, although other numbers of antennas may be selected.

A set of spatial multiplexing weights for each subscriber station are applied to the respective modulated signals to produce spatially multiplexed signals to be transmitted by the bank of four antennas. The host DSP 31 produces and maintains spatial signatures for each subscriber station for each conventional channel and calculates spatial multiplexing and demultiplexing weights using received signal measurements. In this manner, the signals from the current active subscriber stations, some of which may be active on the same conventional channel, are separated and interference and noise suppressed. When communicating from the base station to the subscriber stations, an optimized multi-lobe antenna radiation pattern tailored to the current active subscriber station connections and interference situation is created. Suitable smart antenna technologies for achieving such a spatially directed beam are described, for example, in U.S. Pat. No. 5,828,658, issued Oct. 27, 1998 to Ottersten et al. and U.S. Pat. No. 5,642,353, issued Jun. 24, 1997 to Roy, III et al. The channels used may be partitioned in any manner. In one embodiment the channels used may be partitioned as defined in the GSM (Global System for Mobile Communications) air interface, or any other time division air interface protocol, such as Digital Cellular, PCS (Personal Communication System), PHS (Personal Handyphone System) or WLL (Wireless Local Loop). Alternatively, continuous analog or CDMA channels can be used.

The outputs of the antennas are connected to a duplexer switch 7, which in a TDD embodiment, may be a time switch. Two possible implementations of the duplexer switch are as a frequency duplexer in a frequency division duplex (FDD) system, and as a time switch in a time division duplex (TDD) system. When receiving, the antenna outputs are connected via the duplexer switch to a receiver 5, and are converted down in analog by RF receiver ("RX") modules 5 from the carrier frequency to an FM intermediate frequency ("IF"). This signal then is digitized (sampled) by analog to digital converters ("ADCs") 9. Final down-converting to baseband is carried out digitally. Digital filters can be used to implement the down-converting and the digital filtering, the latter using finite impulse response (FIR) filtering techniques. This is shown as block 13. The invention can be adapted to suit a wide variety of RF and IF carrier frequencies and bands.

There are, in the present example, eight down-converted outputs from each antenna's digital filter 13, one per receive timeslot. The particular number of timeslots can be varied to suit network needs. While GSM uses eight uplink and eight downlink timeslots for each TDMA frame, desirable results can also be achieved with any number of TDMA timeslots for the uplink and downlink in each frame. For each of the eight receive timeslots, the four down-converted outputs from the four antennas are fed to a digital signal processor (DSP) 17 (hereinafter "timeslot processor") for further processing, including calibration, according to one aspect of this invention. Eight Motorola DSP56300 Family DSPs can be used as timeslot processors, one per receive timeslot. The timeslot processors 17 monitor the received signal power and estimate the frequency offset and time alignment. They also determine smart antenna weights for each antenna element. These are used in the SDMA scheme to determine a signal from a particular remote user and to demodulate the determined signal.

The output of the timeslot processors 17 is demodulated burst data for each of the eight receive timeslots. This data is sent to the host DSP processor 31 whose main function is to control all elements of the system and interface with the higher level processing, which is the processing which deals with what signals are required for communications in all the different control and service communication channels defined in the system's communication protocol. The host DSP 31 can be a Motorola DSP56300 Family DSP. In addition, timeslot processors send the determined receive weights for each user terminal to the host DSP 31. The host DSP 31 maintains state and timing information, receives uplink burst data from the timeslot processors 17, and programs the timeslot processors 17. In addition it decrypts, descrambles, checks error correcting code, and deconstructs bursts of the uplink signals, then formats the uplink signals to be sent for higher level processing in other parts of the base station. Furthermore DSP 31 may include a memory element to store data, instructions, or hopping functions or sequences. Alternatively, the base station may have a separate memory element or have access to an auxiliary memory element. With respect to the other parts of the base station it formats service data and traffic data for further higher processing in the base station, receives downlink messages and traffic data from the other parts of the base station, processes the downlink bursts and formats and sends the downlink bursts to a transmit controller/modulator, shown as 37. The host DSP also manages programming of other components of the base station including the transmit controller/modulator 37 and the RF timing controller shown as 33.

The RF timing controller 33 interfaces with the RF system, shown as block 45 and also produces a number of timing signals that are used by both the RF system and the modem. The RF controller 33 reads and transmits power monitoring and control values, controls the duplexer 7 and receives timing parameters and other settings for each burst from the host DSP 31.

The transmit controller/modulator 37, receives transmit data from the host DSP 31. The transmit controller uses this data to produce analog IF outputs which are sent to the RF transmitter (TX) modules 35. Specifically, the received data bits are converted into a complex modulated signal, up-converted to an IF frequency, sampled, multiplied by transmit weights obtained from host DSP 31, and converted via digital to analog converters ("DACs") which are part of transmit controller/modulator 37 to analog transmit waveforms. The analog waveforms are sent to the transmit modules 35. The transmit modules 35 up-convert the signals to the transmission frequency and amplify the signals. The amplified transmission signal outputs are sent to antennas 3 via the duplexer/time switch 7.

User Terminal Structure

Figure 4:
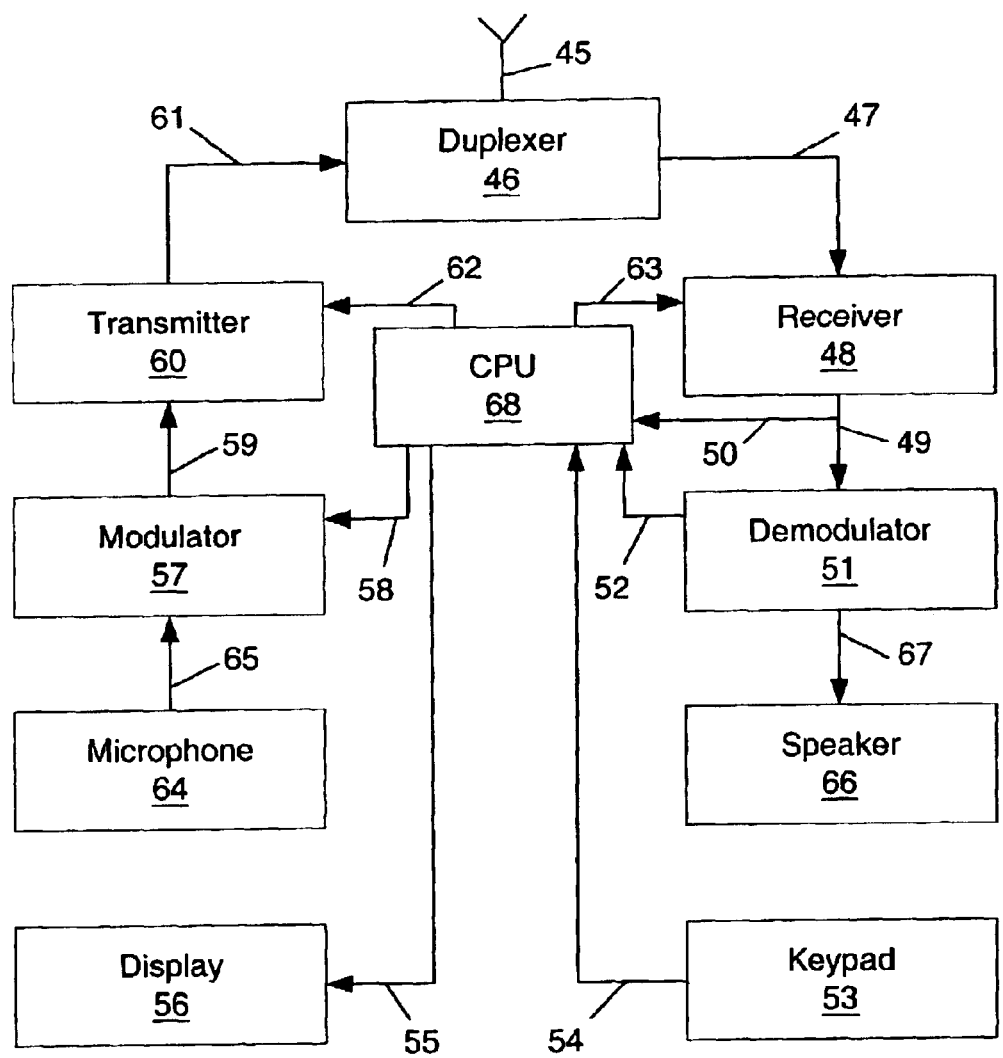
FIG. 4 is a simplified block diagram of a remote terminal on which an embodiment of the invention can be implemented.

FIG. 4 depicts an example component arrangement in a remote terminal that provides data or voice communication. The remote terminal's antenna 45 is connected to a duplexer 46 to permit the antenna 45 to be used for both transmission and reception. The antenna can be omni-directional or directional. For optimal performance, the antenna can be made up of multiple elements and employ spatial processing as discussed above for the base station. In an alternate embodiment, separate receive and transmit antennas are used eliminating the need for the duplexer 46. In another alternate embodiment, where time division duplexing is used, a transmit/receive (TR) switch can be used instead of a duplexer as is well known in the art. The duplexer output 47 serves as input to a receiver 48. The receiver 48 produces a down-converted signal 49, which is the input to a demodulator 51. A demodulated received sound or voice signal 67 is input to a speaker 66.

The remote terminal has a corresponding transmit chain in which data or voice to be transmitted is modulated in a modulator 57. The modulated signal to be transmitted 59, output by the modulator 57, is up-converted and amplified by a transmitter 60, producing a transmitter output signal 61. The transmitter output 61 is then input to the duplexer 46 for transmission by the antenna 45.

The demodulated received data 52 is supplied to a remote terminal central processing unit 68 (CPU) as is received data before demodulation 50. The remote terminal CPU 68 can be implemented with a standard DSP (digital signal processor) device such as a Motorola series 56300 Family DSP. This DSP can also perform the functions of the demodulator 51 and the modulator 57. The remote terminal CPU 68 controls the receiver through line 63, the transmitter through line 62, the demodulator through line 52 and the modulator through line 58. It also communicates with a keyboard 53 through line 54 and a display 56 through line 55. A microphone 64 and speaker 66 are connected through the modulator 57 and the demodulator 51 through lines 65 and 66, respectively for a voice communications remote terminal. In another embodiment, the microphone and speaker are also in direct communication with the CPU to provide voice or data communications. Furthermore remote terminal CPU 68 may also include a memory element to store data, instructions, and hopping functions or sequences. Alternatively, the remote terminal may have a separate memory element or have access to an auxiliary memory element.

In one embodiment, the speaker 66, and the microphone 64 are replaced or augmented by digital interfaces well-known in the art that allow data to be transmitted to and from an external data processing device (for example, a computer). In one embodiment, the remote terminal's CPU is coupled to a standard digital interface such as a PCMCIA interface to an external computer and the display, keyboard, microphone and speaker are a part of the external computer. The remote terminal's CPU 68 communicates with these components through the digital interface and the external computer's controller. For data only communications, the microphone and speaker can be deleted. For voice only communications, the keyboard and display can be deleted.

General Matters

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

The present invention includes various steps. The steps of the present invention may be performed by hardware components, such as those shown in FIGS. 3 and 4, or may be embodied in machine-executable instructions, which may be used to cause a general-purpose or special-purpose processor or logic circuits programmed with the instructions to perform the steps. Alternatively, the steps may be performed by a combination of hardware and software. The steps have been described as being performed by either the base station or the user terminal. However, many of the steps described as being performed by the base station may be performed by the user terminal and vice versa. Furthermore, the invention is equally applicable to systems in which terminals communicate with each other without either one being designated as a base station, a user terminal, a remote terminal or a subscriber station. Thus, the present invention is equally applicable and useful in a peer-to-peer wireless network of communications devices using spatial processing. These devices may be cellular phones, PDA's, laptop computers, or any other wireless devices. Generally, since both the base stations and the terminals use radio waves, these communications devices of wireless communications networks may be generally referred to as radios.

In portions of the description above, only the base station is described as performing spatial processing using an antenna array. However, the user terminals can also contain antenna arrays, and can also perform spatial processing both on receiving and transmitting (uplink and downlink) within the scope of the present invention.

Embodiments of the present invention may be provided as a computer program product, which may include a machine-readable medium having stored thereon instructions, which may be used to program a computer (or other electronic devices) to perform a process according to the present invention. The machine-readable medium may include, but is not limited to, floppy diskettes, optical disks, CD-ROMs, and magneto-optical disks, ROMs, RAMs, EPROMs, EEPROMs, magnet or optical cards, flash memory, or other type of media/machine-readable medium suitable for storing electronic instructions. Moreover, the present invention may also be downloaded as a computer program product, wherein the program may be transferred from a remote computer to a requesting computer by way of data signals embodied in a carrier wave or other propagation medium via a communication link (e.g., a modem or network connection).

Many of the methods and calculations are described in their most basic form, but steps can be added to or deleted from any of the methods and information can be added or subtracted from any of the described message signals without departing from the basic scope of the present invention. It will be apparent to those skilled in the art that many further modifications and adaptations can be made. The particular embodiments are not provided to limit the invention but to illustrate it. The scope of the present invention is not to be determined by the specific examples provided above but only by the claims below.

It should also be appreciated that reference throughout this specification to "one embodiment" or "an embodiment" means that a particular feature may be included in the practice of the invention. Similarly, it should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

What is claimed is:

1. An encoder comprising:

an input to receive a plurality of data bits;

a plurality of parity generators coupled to the input to generate a plurality of parity bits using the data bits;

a controller coupled to the plurality of parity generators to control the plurality of parity generators without accessing a look-up table; and an output coupled to the input and the plurality of parity generators to output the data bits and the parity bits;

wherein the data bits are pipelined from the input to the output.

2. The encoder of claim 1, further comprising a multiplexer coupled to the plurality of parity generators, the controller, and the output, wherein the controller causes the multiplexer to provide each parity bit to the output after the last data bit used by each respective parity generator has been pipelined to the output, but before the next data bit to be pipelined.

3. The encoder of claim 1, wherein the encoder does not have a storage unit.

4. The encoder of claim 1, wherein the controller selectively enables each parity generator in each clock cycle by generating a plurality of enable signals.

5. The encoder of claim 4, wherein the controller generates the plurality of enable signals using a counter.

6. The encoder of claim 1, wherein the plurality of data bits together with the parity bits comprise a codeword, and the encoder comprises a Hamming encoder.

7. A decoder comprising:

an input to receive a binary codeword from a pipelined encoder;

a plurality of syndrome generators coupled to the input to generate a plurality of syndrome bits using the received binary codeword;

a controller coupled to the plurality of syndrome generators to selectively enable the plurality of syndrome generators by generating a plurality of enable signals using a counter; and an error locator coupled to the plurality of syndrome generators to determine a location of an error in the received binary codeword using the plurality of syndrome bits without accessing a look-up table.

8. The decoder of claim 7, further comprising an error corrector coupled to the error locator and the input to correct the error in the received binary codeword; and an output coupled to the error corrector to output the corrected codeword.

9. A The decoder of claim 7, wherein the controller does not access a look-up table.

10. The decoder of claim 7, wherein the counter comprises a down counter.

11. The decoder of claim 7, wherein the received binary codeword comprises a Hamming codeword and the decoder comprises a Hamming decoder.

12. A communications device comprising:

an encoder having:

an input to receive a plurality of data bits;

a plurality of parity generators coupled to the input to generate a plurality of parity bits using the data bits;

a controller coupled to the plurality of parity generators to control the plurality of parity generators without accessing a look-up table; and an output coupled to the input and the plurality of parity generators to output the data bits and the parity bits;

wherein the data bits are pipelined from the input to the output.

13. The communications device of claim 12, further comprising:

a decoder having:

an decoder input to receive a binary codeword from a pipelined encoder;

a plurality of syndrome generators coupled to the decoder input to generate a plurality of syndrome bits using the received binary codeword;

a decoder controller coupled to the plurality of syndrome generators to control the plurality of syndrome generators; and an error locator coupled to the plurality of syndrome generators to determine a location of an error in the received binary codeword using the plurality of syndrome bits without accessing a look-up table.

\* \* \* \* \*